United States Patent

Pietsch et al.

[11] Patent Number: 6,118,409
[45] Date of Patent: Sep. 12, 2000

[54] METHOD AND DEVICE FOR INSPECTING AT LEAST ONE ANTENNA BRANCH, IN PARTICULAR IN A VEHICLE

[75] Inventors: Andreas Pietsch, Haltern; Uwe Dalisda, Essen; Jukka-Matti Karhu, Gelsenkirchen; Jurgen Hess; Holger Christiansen, both of Bochum, all of Germany

[73] Assignee: Nokia Mobile Phones, Ltd., Espoo, Finland

[21] Appl. No.: 09/022,758

[22] Filed: Feb. 12, 1998

[30] Foreign Application Priority Data

Feb. 14, 1997 [DE] Germany .......................... 197 05 735

[51] Int. Cl.[7] .................................................. H04B 1/04
[52] U.S. Cl. ........................ 343/703; 455/126; 455/101; 455/68; 324/98; 375/347
[58] Field of Search .............................. 324/98; 375/347, 375/295; 455/101, 129, 68

[56] References Cited

U.S. PATENT DOCUMENTS

| | | | |
|---|---|---|---|
| 4,110,685 | 8/1978 | Leenerts | 324/58 B |
| 4,703,259 | 10/1987 | Berliner et al. | 324/95 |
| 4,721,901 | 1/1988 | Ashley | 324/58 B |
| 4,856,080 | 8/1989 | Hulkko | 455/139 |
| 4,998,078 | 3/1991 | Hulkko | 333/109 |
| 5,101,175 | 3/1992 | Vaisanen | 330/279 |
| 5,109,538 | 4/1992 | Ikonen et al. | 455/89 |
| 5,118,965 | 6/1992 | Vaisanen et al. | 307/261 |
| 5,152,004 | 9/1992 | Vaisanen et al. | 455/68 |
| 5,204,643 | 4/1993 | Verronen | 333/81 R |
| 5,214,372 | 5/1993 | Vaisanen et al. | 324/95 |
| 5,230,091 | 7/1993 | Vaisanen | 455/88 |
| 5,241,694 | 8/1993 | Vaisanen et al. | 455/126 |
| 5,276,917 | 1/1994 | Vanhanen et al. | 455/89 |
| 5,276,920 | 1/1994 | Kuisma | 455/101 |
| 5,291,147 | 3/1994 | Muurinen | 330/136 |
| 5,392,464 | 2/1995 | Pakonen | 455/115 |
| 5,404,585 | 4/1995 | Vimpari et al. | 455/115 |
| 5,432,473 | 7/1995 | Mattila et al. | 330/133 |
| 5,434,537 | 7/1995 | Kukkonen | 330/2 |
| 5,444,745 | 8/1995 | Ali-Vehmas | 375/347 |
| 5,450,620 | 9/1995 | Vaisanen | 455/127 |
| 5,493,255 | 2/1996 | Murtojarvi | 330/296 |
| 5,530,923 | 6/1996 | Heinonen et al. | 455/126 |
| 5,548,616 | 8/1996 | Mucke et al. | 375/295 |
| 5,564,074 | 10/1996 | Juntti | 455/67.1 |
| 5,675,611 | 10/1997 | Lehtinen et al. | 375/297 |
| 5,697,074 | 12/1997 | Makikallio et al. | 455/126 |

FOREIGN PATENT DOCUMENTS 44 34 915 C1   1/1996   Germany .

OTHER PUBLICATIONS

"Integrierte Mikrowellenschaltungen[Integrated Microwave Circuits]", Springer Verlag ISBN 3–540–12352–0 and ISBN 3–387–12352–0, R.K. Hoffmann, pp. 228–266, 1983.

Pietzko, Harald, Automatische Stehwellen–Anzeige. In:Funkschau 1982, Heft 10, pp. 87–89.

*Primary Examiner*—Don Wong
*Assistant Examiner*—James Clinger
*Attorney, Agent, or Firm*—Perman & Green, LLP

[57] ABSTRACT

In order to inspect at least one antenna branch (A1, A2, . . . An), in particular in a vehicle, a power level to be radiated is initially fed into the antenna branch, after which a power level which is reflected in the antenna branch is sensed. Then, a relationship is formed between the fed-in power level and the reflected power level in order to obtain a quality signal indicating the quality of the antenna branch. This procedure can be carried out successively when there are a plurality of antenna branches, in order to select, as a function of the respective quality signal, that antenna branch at which the reflected power level is lowest. In this way, on the one hand, it is possible to check the matching of the antenna branches while, on the other hand, it is possible to ensure that, for example when specific antenna branches are damaged, it is always possible to find other antenna branches for satisfactory communication.

18 Claims, 4 Drawing Sheets

METHOD AND DEVICE FOR INSPECTING AT LEAST ONE ANTENNA BRANCH, IN PARTICULAR IN A VEHICLE

DESCRIPTION

1. Field of the Invention

The invention relates to a method for inspecting at least one antenna branch, in particular in a vehicle, in accordance with claim 1, and a device for carrying out the method in accordance with claim 14.

2. Background Art

Nowadays, telephones are being increasingly installed in vehicles, to be precise either retrofitted by the customer himself or already installed during the production of vehicles, which may be, for example, motor vehicles. Thus, it is possible, for example, to install two coaxial lines for GSM (Global System for Mobile Communications) antennas which can operate as normal antennas or emergency antennas. However, during the installation or during the later operation of the motor vehicles there is the risk of the coaxial lines, the plugs or the antennas themselves being damaged. Satisfactory communication via these antennas is then possible only with difficulty, or is no longer possible at all. Corresponding problems also occur in antenna branches of Global Positioning Systems (GPS).

SUMMARY OF THE INVENTION

The invention is based on the object of providing a method and a device in order to be able to check better the operational reliability of antenna branches.

A method solution of the object set is specified in claim 1. In contrast, a device solution of the object set is given in claim 6. Advantageous refinements of the invention can be found in the respective dependent subclaims.

A method according to the invention for inspecting at least one antenna branch, in particular in a vehicle, comprises the following steps: a power level which is to be radiated is fed into the antenna branch; a power level which is reflected in the antenna branch is sensed; a relationship is established between the fed-in power level and the reflected power level in order to obtain a quality signal indicating the quality of the antenna branch. Here, in order to form the quality signal, a ratio can also be established between the fed-in power level and the reflected power level.

Depending on whether a small amount or a large amount of reflected power is sensed, the quality signal can be categorized as good or bad. If the reflected power lies below a predetermined level, the checked antenna branch is made available for communication. If, on the other hand, the reflected power level exceeds a predetermined level, the checked antenna branch is disabled for further communication. A significant reason for this is also to protect the power output stage of the transmitter against damage, that is to say in particular the RF power amplifier.

The method according to the invention can be applied at any suitable time, for example whenever a communications system which is connected to the antenna branch is newly commissioned, periodically or at any other suitable time at which the communication system allows this to take place.

According to one very advantageous refinement of the invention, the power to be radiated and the reflected power are sensed with the aid of a bidirectional measuring directional coupler present in the antenna branch.

Such measuring directional couplers are generally known and can easily be connected to the RF transmitter on the output side. The forward waves and return waves extracted from the measuring directional coupler can then, for example, be rectified in order to make available D.C. voltages proportional to the respectively extracted power levels, which voltages can be used, for example, to determine a standing wave ratio (VSWR) which is then used as a quality signal. However, the aforesaid D.C. voltages can initially also be individually digitized and then further processed to form the quality signal.

According to another refinement of the invention, the method is carried out successively for a plurality of antenna branches, in order to select, as a function of the respective quality signals, that antenna branch at which the reflected power level is lowest.

In particular in the case of motor vehicles, there is frequently provision of two antenna connection possibilities, one antenna being provided as a normal transmission/reception antenna on the outside of the vehicle while a second antenna, provided as an emergency antenna, is located at a more protected installation point, for example on the parcel shelf or in the boot. If, in the case of an accident, the antenna provided on the outside of the motor vehicle is damaged or destroyed, it is necessary, after the accident, to make a connection to the base station from a telephone connected to the antenna branches, in order to be able to make an emergency call. This can be done by the driver of the motor vehicle or by an automatically operating emergency detector in the motor vehicle. The antenna branch at which the lowest reflections have been measured, that is to say in this case the emergency antenna, is then available for the emergency call.

As already mentioned above, the use of active antenna branches can be surveyed periodically, to be precise at such short time intervals that after an accident and after the normal transmission/reception antenna has been broken, the existing further antenna branch can very quickly be selected to make the emergency call. The selection of the most favourable antenna branch can, however, also be made at the instigation of the emergency detector after it has detected an accident.

A device according to the invention for inspecting at least one antenna branch, in particular in a vehicle, comprises: an RF power amplifier for feeding into the antenna branch power to be radiated; a bidirectional measuring directional coupler which is located between the RF power amplifier and the antenna branch and which extracts the power level to be radiated and a reflected power level, each reduced by the coupling attenuation; and an evaluation circuit which receives the extracted power to be radiated and the extracted reflected power and generates, as a function thereof, a quality signal which indicates the quality of the antenna branch. In this context, the evaluation circuit may have an assessment stage which forms the quality signal by reference to the D.C. voltages which are proportional to the respective forward and reverse powers, or by reference to their digital values.

The bidirectional measuring directional coupler comprises coupled microstrip lines on a dielectric substrate. Such a measuring directional coupler is already known from R. K. Hoffmann, "Integrierte Mikrowellenschaltungen [Integrated Microwave Circuits]", Springer Verlag ISBN 3-540-12352-0 and ISBN 3-387-12352-0.

In a development of the invention, a change-over switch is provided which, depending on the switched position, connects the output of the bidirectional measuring directional coupler to, in each case, one of a plurality of antenna branches, it being possible for the evaluation circuit to drive the change-over switch in order to change its switched position.

In the event that only two antenna branches are present and both are damaged, one of these antenna branches is selected according to a prescribed algorithm, for example the normal transmission/reception antenna on the outside of a motor vehicle. When there are a plurality of operationally available antenna branches and only one or more defective antenna branches, an operationally available antenna branch is also selected according to a previously known algorithm, as already mentioned. Such a selection algorithm is part of the prior art, so that it is not necessary to give further details on it at this point.

BRIEF DESCRIPTION OF THE DRAWINGS

The invention is explained in detail below with reference to the drawing, in which.

DETAILED DESCRIPTION OF THE PREFERRED EMBODIMENTS

Figure 1:
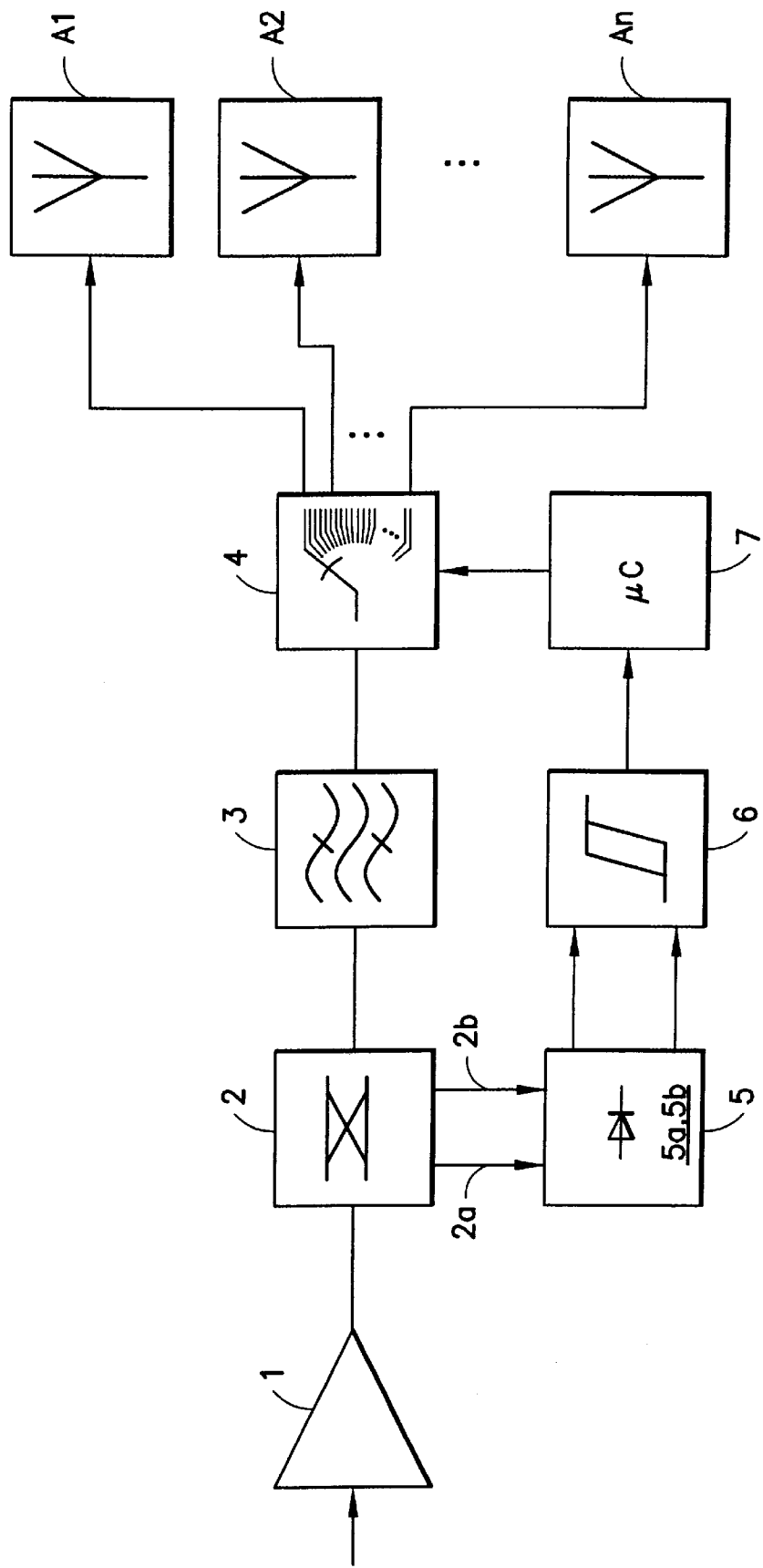
FIG. 1 shows a block circuit diagram of an RF system with automatic antenna branch selection.

FIG. 1 shows a block circuit diagram of an RF system in which an automatic switch-over of the antenna branch and/or of the antenna is performed as a function of the matching of the transmission antenna to the antenna connection.

In order to measure the matching of the transmission antenna to the antenna connection, it is necessary to measure the forward wave and the return wave per antenna branch.

In order to permit this, a bidirectional measuring directional coupler 2, which extracts a power level which is proportional to the forward wave and a power level which is proportional to the return wave, is connected downstream of a high-frequency amplifier 1, which may be for example the output amplifier of a mobile telephone.

In the transmission branch, after the power generated by the high-frequency amplifier has passed through the measuring directional coupler 2, said power passes through a bandpass filter 3, for example the Tx filter branch of the duplex filter of a GSM telephone, and then passes through an antenna change-over switch 4 for the selection of an antenna branch and/or a transmission antenna. In the present case, the output of the duplex filter 3 can be applied in chronological succession to a plurality of antennas A1, A2, . . . An via the antenna change-over switch 4. The high-frequency power of the high-frequency amplifier 1 is finally radiated through one of these transmission antennas A1, A2, . . . An The characteristic impedance of an antenna must correspond here to the characteristic impedance of the RF system (generally 50Ω) in order to be able to radiate in an optimum fashion the power generated by the high-frequency amplifier 1. If the characteristic impedance of the antenna is not matched to the system, for example if an antenna plug is defective, if there is a fracture in the antenna cable or an antenna is missing, part of, or even all, the high-frequency power is reflected, with the result that it goes back through the system in the reverse direction. This leads to a situation in which only a reduced power level can be radiated via the respective antenna, and even to a total loss of power.

The bidirectional measuring directional coupler 2 is designed here as a four gate. The function of the measuring directional coupler 2 is to extract in each case a power level which is proportional to the forward wave and a power level which is proportional to the return wave. The outputs 2a and 2b are provided for this purpose.

The forward wave, which is reduced by the coupling attenuation, is extracted from the measuring directional coupler via the output 2a, while the return wave, which is reduced by the coupling attenuation, is extracted from the measuring directional coupler via the output 2b. Both waves are initially rectified separately, specifically in the rectifier device 5. This leads to D.C. voltages which are proportional to the respectively extracted power levels being available after the rectification, which voltages can be used to determine, for example, a standing wave ratio VSWR of the respective transmission antenna. The quotient forming stage 6 is used to form the standing wave ratio. The standing wave ratio VSWR can be determined in an analogous fashion and can give rise to antenna good/antenna bad information (quality signal).

A controller 7 (microcomputer unit) which is connected to the output of stage 6 assumes the function of storing the quality signals for the respective antennas A1, A2, . . . , An (good/bad) and of controlling the antenna change-over switch 4 as a function of the quality signals.

The absence of an antenna or the detection of a bad and/or broken antenna thus leads to the RF amplifier 1 switching over directly to an antenna with adequate matching. Antennas which have been assessed to be "bad" are disregarded from this, while the remaining antennas, which have been evaluated as "good" are evaluated as a function of a further algorithm in order to select a suitable antenna from them. This is also carried out using the controller 7.

This avoids a situation in which, for example in the case of a GSM system, the telephone attempts to set up a connection for a relatively long time even though this is impossible because the currently connected antenna cannot radiate any power, or only insufficient power, into space. The system is thus capable of detecting, independently and in a very short time, which antenna is suitable for transmission operations, and which is not. For this purpose, the controller 7 is capable of sampling and/or surveying all the antennas and/or antenna branches successively or in cycles.

Since the measuring arrangement prevents a transmission to a bad or non-existent antenna, this also avoids operational cases in which, inter alia, the high-frequency amplifier could suffer damage (undefined output matching) or interference variables (undesired oscillations) could be transmitted. The service life, security and reliability of the system are thus increased. The measurements can also be used to check the satisfactory installation (for example in the case of a car telephone) and functioning of the installed system.

Figure 2:
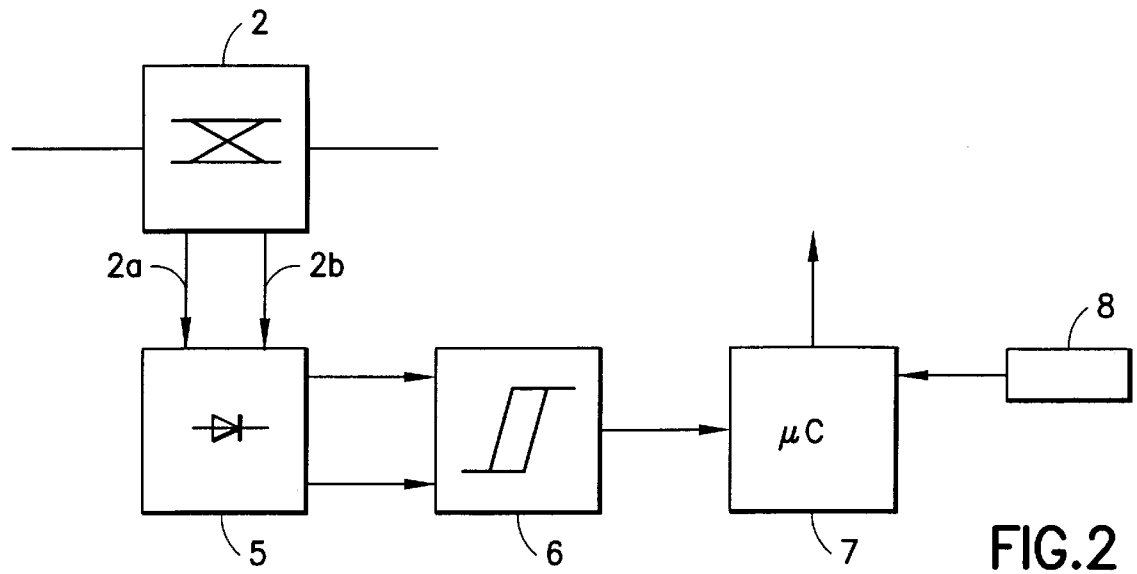
FIG. 2 shows part of the block circuit diagram according to FIG. 1 with analogue quality signal formation and accident detector.

In the case of a telephone which has been installed in a motor vehicle and has a main antenna and emergency call antenna, when there is an emergency call which has been initiated automatically, for example after a traffic accident, the system can select a suitable antenna without delay in order to make the emergency call. If the controller 7 does not in any case check the antennas continuously or at very brief intervals, said controller can be activated and made to do this by an accident detector 8. This accident detector 8 can also activate the telephone automatically, should the user of the motor vehicle no longer be in a position to do so. FIG. 2 shows the appropriately developed circuit component from FIG. 1.

Figure 3:
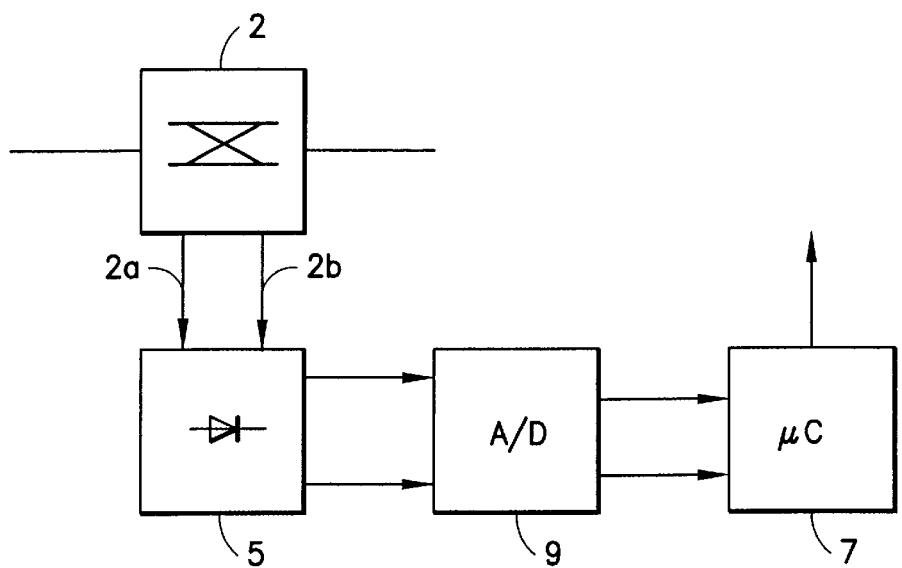
FIG. 3 shows another variant of the circuit arrangement according to FIG. 2 with digital quality signal formation.

A further possible way of determining the standing wave ratio VSWR precisely from the two D.C. voltages supplied by the rectifier device 5 is to digitize the two measured values initially in an analog-to-digital converter 9 and then to calculate them in the microprocessor unit 7. This is shown in FIG. 3. The microprocessor unit 7 can then control the antenna change-over switch 4 as a function of the magnitude of the value calculated for the standing wave ratio VSWR.

Figure 4:
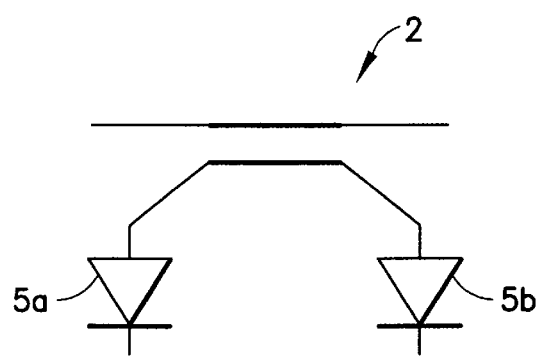
FIG. 4 shows an equivalent diagram of a measuring directional coupler for the circuit arrangements according to FIGS. 1 to 3, and FIGS. 5, 5A and 5B show a flow chart for explaining the method according to the invention with FIG. 5 showing how to arrange FIGS. 5A and 5B.

FIG. 4 shows the precise design of measuring directional coupler 2 and a rectifier device 5. In a known manner, the measuring directional coupler 2 consists of two microstrip lines which run one next to the other in close proximity and which are located on a surface of a dielectric substrate, on whose other surface there is an earthing metallization. The microstrip lines are electromagnetically coupled to one another. One of the microstrip lines which is of straight design is connected by one of its ends to the output of the line amplifier 1 and by its other end to the input of the bandpass filter 3. The other microstrip line is bent at its ends in comparison with the first microstrip line, the ends of this other microstrip line being connected, in each case via a diode 5a, 5b, to different inputs of the quotient-forming stage 6 in FIGS. 1 and 2, or to different inputs of the analog-to-digital converter 9 in FIG. 3. Instead of the diodes 5a, 5b, transistors which are each connected to diodes may also be used.

The invention could, for example, be used in car telephones, radio telephones, radios, radio transmission equipment, antenna equipment in vehicles and buildings, and the like.

Figures 5, 5A:
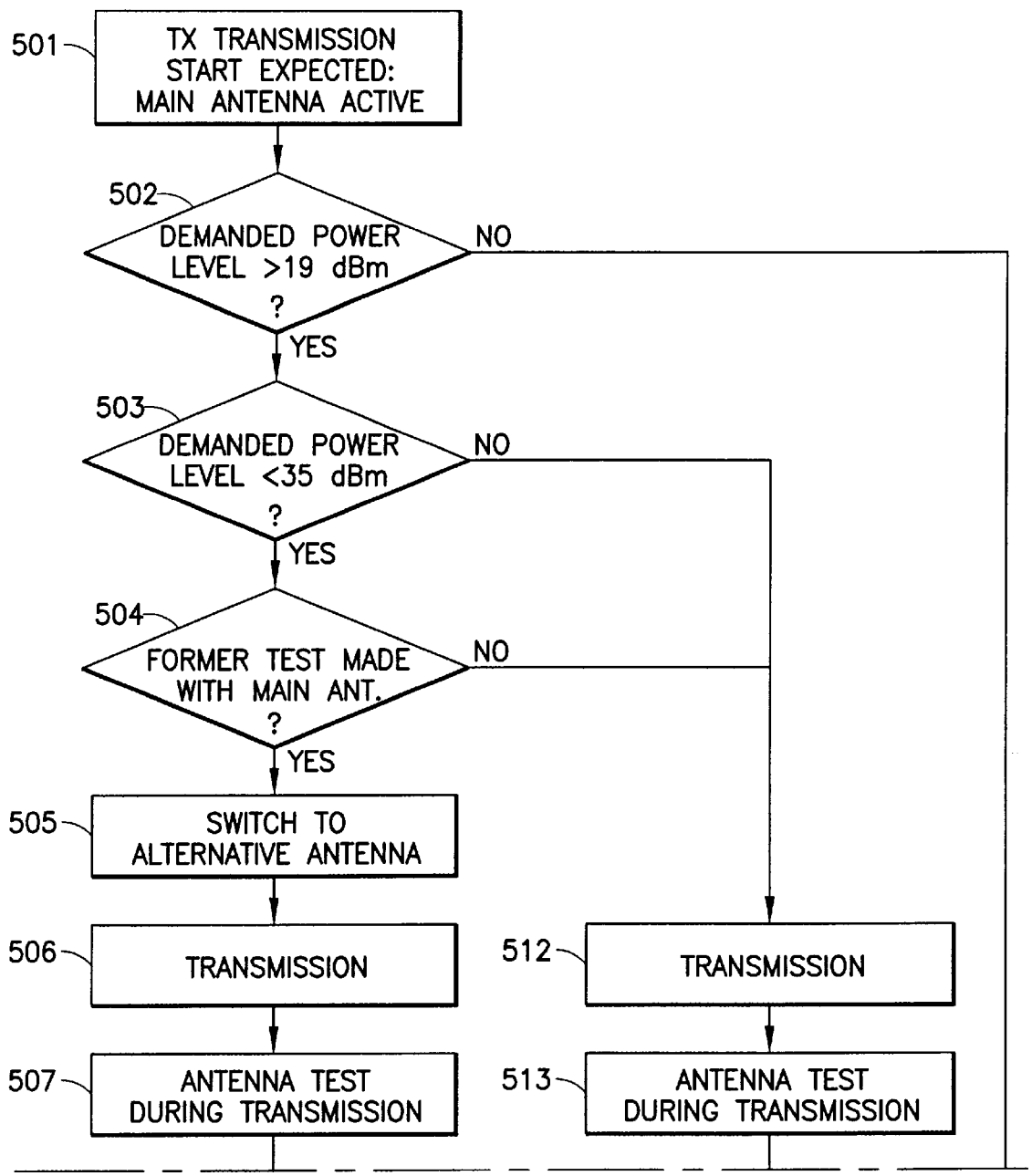
Figure 5B:
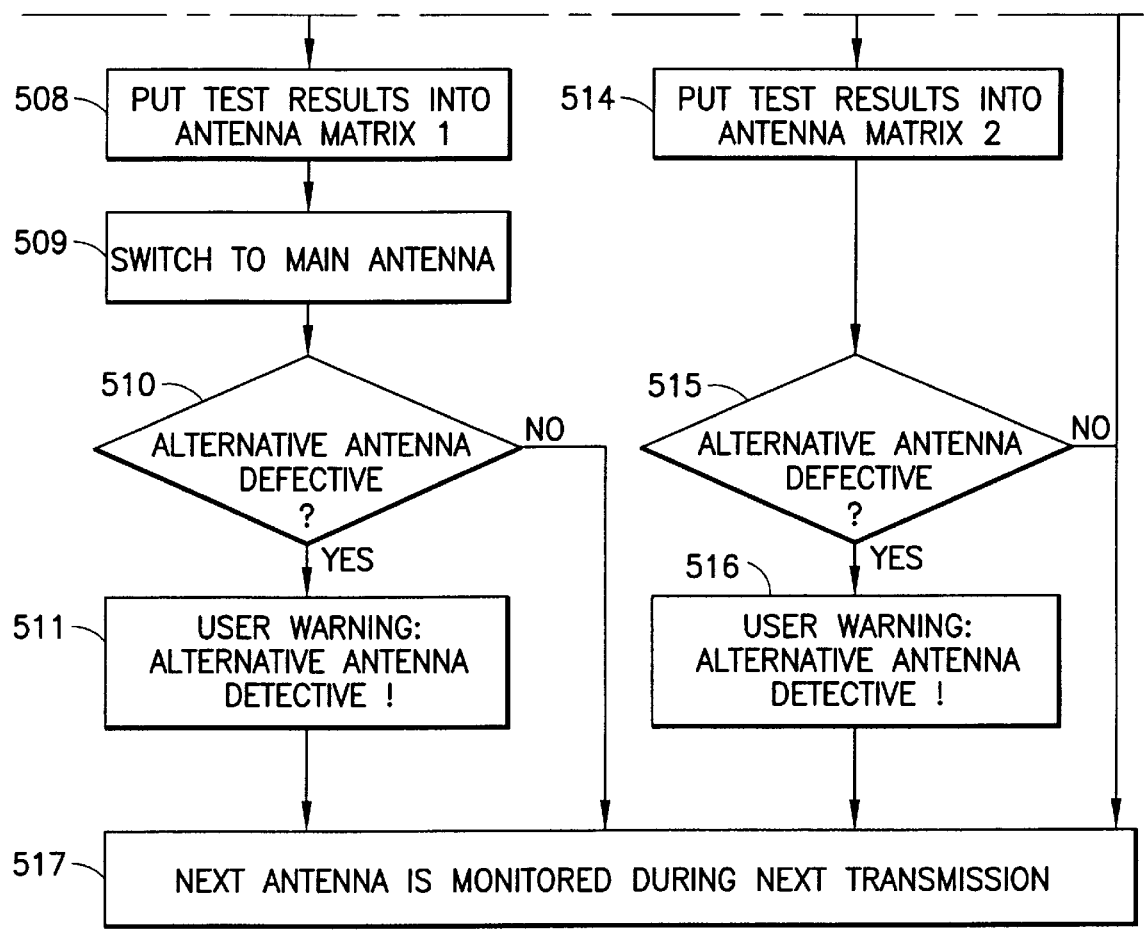

An application of the invention, such as could be realized, for example, in the cellular GSM system (Global System for Mobile Communication) is described with reference to the flow chart of FIGS. 5A and 5B.

In this flow chart it is assumed that a car telephone (mobile station) is equipped with a main antenna, which is mounted on the outside of the vehicle, and an alternative antenna. The alternative antenna is to be activated only in an emergency, for example if the main antenna has been damaged in an accident.

In step 501, the transmission of a signal from the mobile station to the base station within the cellular mobile telephone network is imminent. The main antenna of the mobile station is switched on.

As is customary in cellular networks, the transmit power of the mobile station is prescribed by the base station in order to achieve a good transmission quality even with minimum transmit power.

Since there is coupling attenuation owing to the coupling structure for the return wave and to the signal-conducting microstrip conductor track, the measurement of the return wave is restricted to specific power level ranges. For this reason, in step 502 there is initially an interrogation to determine whether the transmit power level required by the base station is>19 dBm (79 mW). If this is not the case, an antenna measurement cannot be carried out and the system branches to step 517.

In order to ensure that no high-frequency radiation which exceeds a maximum value is radiated within the vehicle during the antenna test, the antenna test of the alternative antenna which is located in the interior of the vehicle is not carried out above a specific transmit power. For this reason, in step 503 there is an interrogation to determine whether the required transmit power exceeds a predetermined value which in this case is 33 dBm=2 Watt.

If this value is exceeded, only one antenna test can be carried out for the main antenna and the system branches to step 512.

If an antenna test has still been carried out after the mobile station has been switched on, the priority is to test the main antenna. For this reason, in step 504 there is an interrogation to determine whether an antenna test has already been carried out. If this is not the case, the system branches to step 512 in order to test the main antenna.

If the prescribed transmit power is in the region between the minimum and maximum transmit level for a measurement of the alternative antenna and if the main antenna has already been tested, the alternative antenna can be tested, and in step 505 the system is switched over to the alternative antenna.

In step 506, the outgoing transmission via the alternative antenna starts, and in step 507 the antenna test is carried out during the outgoing transmission. The antenna test can be carried out, for example, right at the beginning of the transmission of the RACH (Random Access Channels) with which the mobile station signs on at the base station and requests a channel for a call.

In step 507, the reflected power is simultaneously detected and evaluated. The result of the antenna test is entered into the results table 1 in step 508.

In order to prevent unnecessary use of the alternative antenna, in step 510, after the antenna test of the alternative antenna has been terminated, the system is switched over again immediately to the main antenna.

If the result of the testing of the alternative antenna is that it is satisfactory, the system branches into step 517.

If it becomes evident that the alternative antenna does not satisfy the requirements, in step 511 it is indicated to the user, for example by means of the mobile telephone display, that the alternative antenna is defective.

The test of the main antenna is carried out in steps 512–514 in a way analogous to the test of the alternative antenna. Since the main antenna is, as described above, initially switched on as a matter of principle, it is not necessary here first to switch over to the main antenna. In step 514, the result of the main antenna test is entered into the results table 2.

In step 516, the result of the measurement is interrogated from the results table 2. If a defect in the main antenna is detected, this is communicated to the user in step 516.

If no defect is detected at the main antenna, the system branches to step 517 and the test sequence is started again at the next outgoing transmission.

The advantage of the method described in this flow chart consists, in particular, in the fact that the antenna measurements can be carried out during the normal operation of the mobile station within the cellular mobile radio system, without disrupting the mobile radio system by non-standard broadcasting of signals.

What is claimed is:

1. A method for inspecting antenna branches of a vehicle, said antenna branches including a main antenna mounted outside the vehicle and an alternative antenna mounted at a position within the vehicle, comprising:

feeding power to be radiated into one of the antenna branches;

sensing power which is reflected in each one of the antenna branches; and forming a relationship between the power which is fed and the power which is reflected in order to obtain a quality signal which indicates quality of respective antenna branches;

wherein, when said power to be radiated lies above a first predetermined value, switching to the alternative antenna is prevented.

2. A method according to claim 1, wherein in order to form the quality signal, a ratio is formed between the fed-in power and the reflected power.

3. A method according to claim 1, wherein the power to be radiated and the reflected power are sensed using a bidirectional measuring directional coupler located in the antenna branch.

4. A method according to claim 3, wherein the sensed value of the power to be radiated and the sensed value of the reflected power are digitized in order to form the quality signal.

5. A method according to claim 1, wherein said method is carried out successively for a plurality of antenna branches, in order to select, as a function of the respective quality signals, that antenna branch at which the reflected power level is lowest.

6. A method according to claim 1, wherein said method is carried out using a mobile station to which the at least one antenna branch is connected.

7. A method according to claim 6, wherein a car telephone or a portable mobile telephone (mobile phone) is used.

8. A method according to claim 1, wherein, when power to be radiated is below a second predetermined value, the second predetermined value being lower than the first predetermined value, the reflected power is not measured.

9. A method according to claim 1, wherein, when transmit power lies above the second predetermined value and below the first predetermined value, the power reflected by the alternative antenna is measured.

10. A method according to claim 6, wherein, after the mobile station has been switched on, the power reflected by the main antenna is initially measured.

11. A method according to claim 1, wherein the inspection is carried out during an outgoing transmission.

12. A method according to claim 11, wherein the inspection is carried out at the beginning of the transmission of an RACH (Random Access Channel).

13. A device for inspecting at least one antenna branch, in a vehicle, the vehicle having antenna branches including a main antenna mounted outside of the vehicle and an alternative antenna at a position within the vehicle, comprising:

an RF power amplifier for feeding into the antenna branch a power level to be radiated;

a bidirectional measuring directional coupler, which is located between the RF power amplifier and the antenna branch and which extracts, in each case reduced by coupling attenuation, the power level to be radiated and a reflected power level;

an evaluation circuit, which receives the extracted and reflected power levels and generates, as a function thereof, a quality signal which indicates quality of the antenna branch; and a controller for controlling switching of energy from said RF power amplifier to said antenna branches, said controller preventing switching to said alternative antenna if power to be radiated exceeds a first predetermined level.

14. A device according to claim 13, wherein the evaluation circuit has rectifiers in order, respectively, to rectify extracted waves to be radiated and extracted reflected waves.

15. A device according to claim 14, wherein the evaluation circuit has A/D converters in order to digitize D.C. voltages which are proportional to the respective forward power levels or reverse power levels.

16. A device according to claim 14, wherein the evaluation circuit has an assessment stage which generates the quality signal with reference to the D.C. voltages, or their digital values, which are proportional to the respective forward power levels and reverse power levels.

17. Device according to claim 13, characterized by a change-over switch (4) which, depending on the switched position, connects the output of the bidirectional measuring directional coupler (2) to, in each case, one of a plurality of antenna branches (A1, A2, . . . An), it being possible to drive the change-over switch (4) by means of the evaluation circuit, in order to change the switched position of said switch (4).

18. The device according to claim 13, wherein when the power to be radiated by an antenna branch is below a second predetermined value, the second predetermined value being lower than the first predetermined value, a quality signal is not generated for that antenna branch.

* * * * *